United States Patent
Pankove

[11] Patent Number: 5,930,666
[45] Date of Patent: Jul. 27, 1999

[54] METHOD AND APPARATUS FOR PACKAGING HIGH TEMPERATURE SOLID STATE ELECTRONIC DEVICES

[75] Inventor: Jacques Isaac Pankove, Boulder, Colo.

[73] Assignee: Astralux, Incorporated, Boulder, Colo.

[21] Appl. No.: 08/948,110

[22] Filed: Oct. 9, 1997

[51] Int. Cl.[6] ................................. H01L 21/44
[52] U.S. Cl. ................... 438/615; 438/612; 438/613
[58] Field of Search .................. 438/615, 612, 438/613

[56] References Cited

U.S. PATENT DOCUMENTS

| | | |
|---|---|---|
| 3,387,365 | 6/1968 | Stelmak . |
| 3,480,492 | 11/1969 | Hauser . |
| 3,628,716 | 12/1971 | Fastre . |
| 4,312,117 | 1/1982 | Robillard et al. . |
| 4,534,811 | 8/1985 | Ainslie . |
| 4,674,671 | 6/1987 | Fister et al. . |
| 4,842,662 | 6/1989 | Jacobi . |
| 4,903,883 | 2/1990 | Thurlemann et al. . |
| 4,970,365 | 11/1990 | Chalco . |
| 5,186,378 | 2/1993 | Alfaro . |
| 5,240,166 | 8/1993 | Fontana, Jr. . |
| 5,326,014 | 7/1994 | Morita et al. . |
| 5,338,704 | 8/1994 | Imai ........................................ 438/119 |
| 5,341,979 | 8/1994 | Gupta . |
| 5,364,009 | 11/1994 | Takahashi et al. . |
| 5,482,896 | 1/1996 | Tang ........................................ 438/118 |
| 5,661,082 | 8/1997 | Hsu et al. ............................... 438/612 |
| 5,728,623 | 3/1998 | Morz ...................................... 438/455 |

*Primary Examiner*—Kevin M. Picardat
*Assistant Examiner*—Deven Collins
*Attorney, Agent, or Firm*—Francis A. Sirr; Earl C. Hancock; Holland & Hart llp

[57] ABSTRACT

A semiconductor-chip is bonded to a chip-carrier substrate by way of a gold-to-gold bonding interface. A vacuum chuck is provided to physically hold the semiconductor-chip in physical contact with, the chip-carrier substrate as static force, ultrasonic power, and an elevated temperature are applied to two mating gold surfaces that are formed by two continuous and physically mating gold layers. The bonded assembly is encased in a potting ceramic, or the bonded assembly is encased in a housing that includes a transparent cover that enables use as an optoelectronic semiconductor device.

15 Claims, 4 Drawing Sheets

ALN CHIP CARRIER

METHOD AND APPARATUS FOR PACKAGING HIGH TEMPERATURE SOLID STATE ELECTRONIC DEVICES

BACKGROUND OF THE INVENTION

1. Field of the Invention

This invention relates to the field of metal fusion bonding, and more specifically this invention provides for the low cost thermosonic bonding, or fusing, of a gold-coated semiconductor-chip to a gold-coated chip-carrier substrate member, wherein the two mating gold coatings, on the semiconductor-chip and the substrate member respectively, each comprise a continuous film of gold.

2. Description of the Related Art

Solid state high temperature electronic devices have been made from a wide variety of bandgap semiconductor materials, such as SiC and $Ga_xAl_{1-x}N$. These high temperature electronic devices may be three electrode devices, such as transistors, or thyristors, rectifiers, Integrated Circuits (ICs), detectors, etc., and electronic devices of these types may include components, such as capacitors, inductors and resistors that are suitable for high temperature operation.

High temperature semiconductor devices are usually physically packaged using a material(s) whose thermal expansion coefficient (TEC) matches the TEC of the semiconductor device being packaged. This generally external packaging material maybe an electrically insulating material, such as a potting material, AlN, SiC, a ceramic, or a ceramic that is a combination of AlN and SiC.

The semiconductor device usually comprises both a semiconductor-chip, or chip-portion, and a chip-carrying substrate or substrate-portion on which the semiconductor-chip is physically mounted. The chip-carrying substrate is usually provided with metallized areas of some type to which the semiconductor-chip's input/output/power electrodes, and perhaps other external leads, or wires, are connected. Such a metallization material may be applied to these areas of the chip-carrying substrate by an evaporation process, a sputtering process, a plating process, or a printing process. Suitable metallization materials include tungsten, nickel, titanium, molybdenum, and noble metals such as Au and Pt.

Ultrasonic bonding is generally known, as is shown by the following representative examples. U.S. Pat. No. 4,534,811 provides for the bonding of two elements by the use of laser-heat and an ultrasonic vibrating force. U.S. Pat. No. 4,674,671 teaches the bonding of fine aluminum, gold or palladium wires using ultrasonic energy and pressure. U.S. Pat. No. 4,842,662 describes the bonding of a lead to an IC chip by the use of gold bumps that are located between the lead and a platinum/titanium film that is carried by the IC chip. The use of heat, ultrasonic oscillation, and mechanical pressure is mentioned. U.S. Pat. No. 4,970,365 teaches bonding gold-coated leads to copper pads by the use of a bonding tip, laser-heat, static force, and ultrasonic energy. Gold-to-gold interface bonding is also mentioned. U.S. Pat. No. 5,186,378 describes forming a microelectronic bond by the use of heat and an ultrasonic transducer. U.S. Pat. No. 5,240,166 describes a thermally enhanced ultrasonic bonding tool having a thin film resistor disposed on the tool's bonding tip.

Yet other examples of bonding are found in U.S. Pat. Nos. 3,387,365, 3,480,492, 3,628,716, 4,312,117, 4,903,883, 5,326,014, and 5,364,009.

U.S. Pat. No. 5,341,979 to Gupta is of interest in that it describes the use of an ultrasonic/thermosonic coil and control apparatus 50 to bond a substrate 35 to a semiconductor die 10. As shown in FIGS. 1–4, semiconductor die 10, which is formed from a gallium arsenide substrate (col 2, lines 59–63), includes an active semiconductor device 11 that may be a MOSFET, JFET, BJT, etc (col 2, lines 63–67). Bonding pads 14,15,17 are provided on die 10. Bonding pads 14,15 are multi-layer nickel, germanium, tungsten, nickel and gold, wherein nickel contacts the major surface 12 of die 10 (col 3, lines 10–14). As shown in FIG. 5, gold hour-glass shaped bumps 30 are provided to thermosonic bond pads 14,14,17 of die 10 to contact pads 44,46,47 on substrate 35 (col 5, line 61, to col 5, line 17). The patent suggests a bonding temperature range of less than about 180° C. (col 5, lines 44–46), a force equivalent to a mass ranging between about 50 grams and 1,500 grams (col 5, lines 65–68), and a range of movement of thermosonic tool/end-effector 52 (col 6, lines 1–10).

While methods and apparatus as described above are generally useful for their limited intended purposes, the need remains in the art for a method and apparatus that provides for bonding a semiconductor-chip to an underlying chip-carrier or substrate, wherein the final packaged semiconductor-chip/chip-carrier assembly is capable of withstanding high operating temperatures, wherein the bonding method/apparatus is reliable and repeatable, and wherein the required bonding can be provided at a relative low cost.

SUMMARY OF THE INVENTION

This invention provides a semiconductor assembly wherein a semiconductor-chip is bonded to a chip-carrier substrate by way of a gold-to-gold bonding interface. In the method of this invention, a vacuum chuck physically holds the semiconductor-chip in physical contact with the chip-carrier substrate, as static force, ultrasonic power, and an elevated temperature are applied to two mating gold surfaces that are formed by two continuous and physically mating gold layers. The finished bonded assembly is encased in a potting ceramic, or the finished bonded assembly is encased in a housing that includes a transparent cover that enables use as an optoelectronic semiconductor device. This cover may comprise single crystal AlN, sapphire, and/or a UV transparent material.

An object of this invention is to provide an AlN substrate member whose generally flat upper surface includes a first, a second, and a third physically spaced, upward facing, and continuous gold layer thereon. The first and second gold layers are located at a border area of the substrate member. The third gold layer has a first minor portion that is located at the border area of the substrate member, adjacent to the first and second gold layers. The third gold layer also includes a second major portion that is formed integrally with the first minor portion, this second major portion being located inward of the border area of the substrate member.

A first, second and third, gold-coated, flat-surface, tungsten pin have their flat surfaces, respectively, gold-to-gold bonded to the first gold layer, the second gold layer, and the first minor portion of the third gold layer. These first, second and third gold-coated tungsten pins each have an end that extends beyond the border area of the substrate member. These pins are adapted for mounting are attaching the substrate member to a related device, such as a socket or the like.

A high temperature, three-electrode, SiC and GaN-based, semiconductor chip is provided having a generally flat bottom gold surface that comprises a first gold electrode having an upper surface with a second gold electrode thereon, and having a third gold electrode thereon.

The bottom gold surface of the semiconductor chip is gold-to-gold bonded to the second major portion of the third gold layer that is on the substrate member, this bonding taking place in the presence of static force, ultrasonic energy, and an elevated temperature.

A first gold wire connects between the upper-surface of the semiconductor chip's second gold electrode and the substrate's first gold layer. A second gold wire connects between the upper-surface of the semiconductor chip's third gold electrode the substrate's second gold layer. These connections are made by virtue of gold-to-gold bonding.

As a feature of the invention, an electrically insulative paste is provided to cover and seal the upper surface of the chip/substrate/wire assembly in a manner to leave the extending ends of the gold-coated tungsten pins exposed.

As an additional feature of the invention, an optoelectronic semiconductor chip device is provided and an electrically insulative housing provides an optically transparent cover, an AlN cover, a sapphire cover, or a UV transparent cover.

These and other objects, features and advantages of the invention will be apparent to those of skill in the art upon making reference to the following detailed description, which description makes reference to the drawing.

DESCRIPTION OF THE PREFERRED EMBODIMENT

Figure 1:
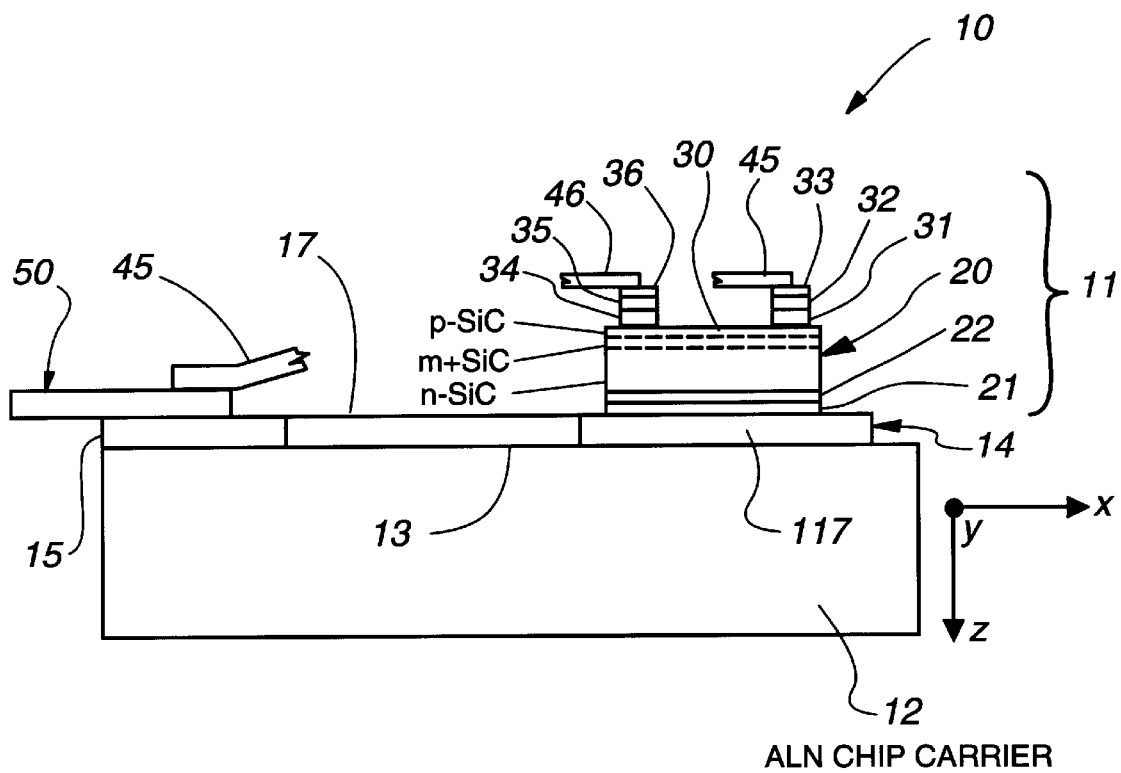
FIG. 1 is a side view of an assembly that comprises an upper semiconductor-chip and a lower chip-carrier substrate in accordance with the present invention.
Figure 2:
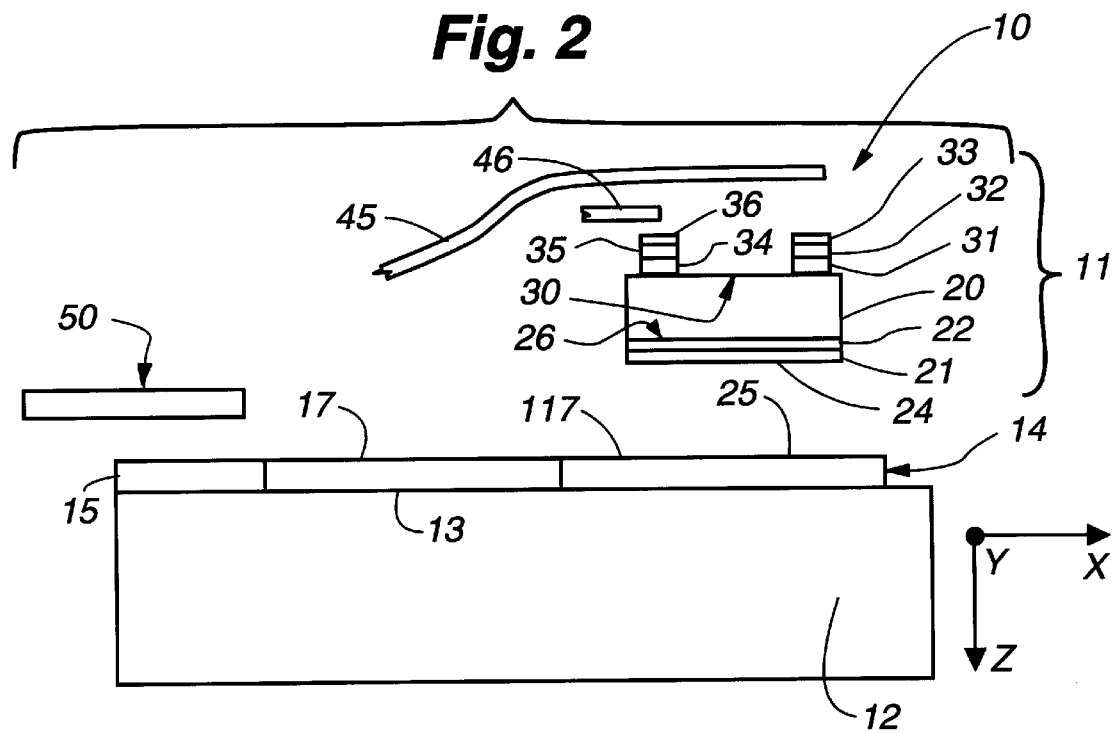
FIG. 2 is an exploded view of the assembly FIG. 1.
Figure 3:
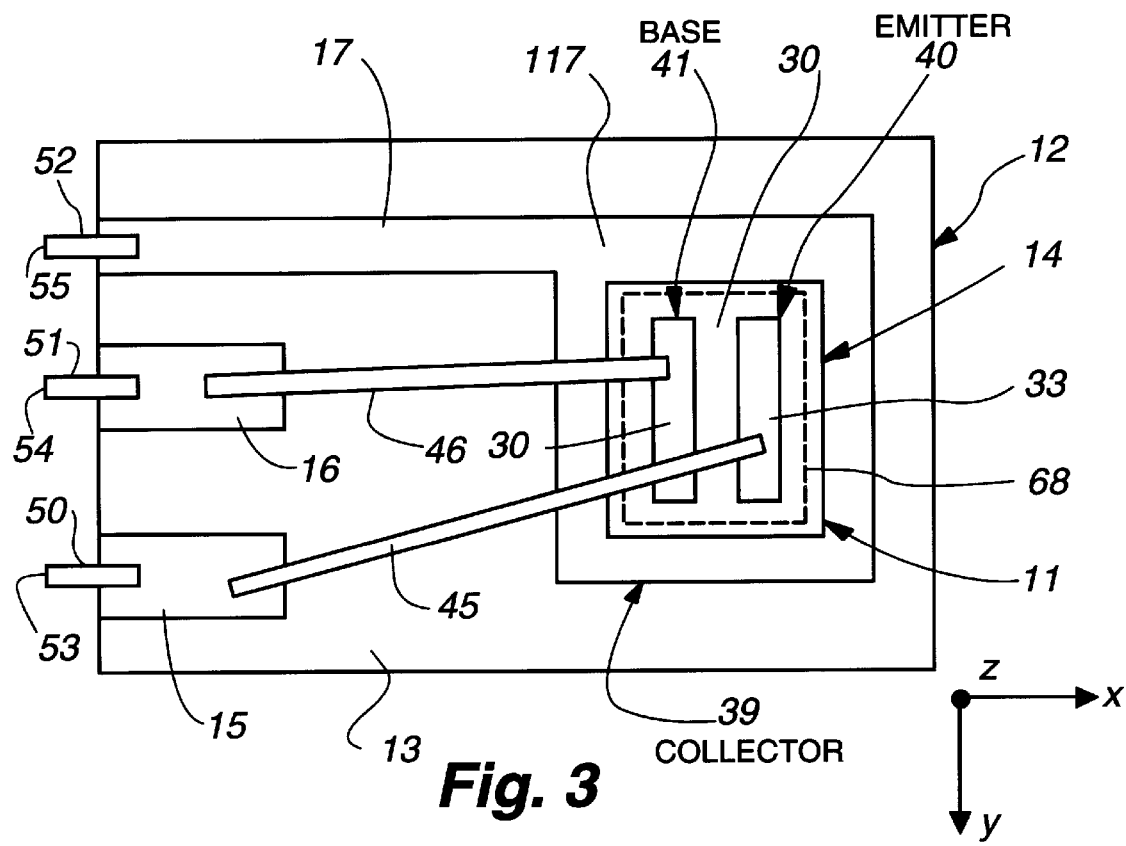
FIG. 3 is a top view of the assembly of FIG. 1.
Figure 4:
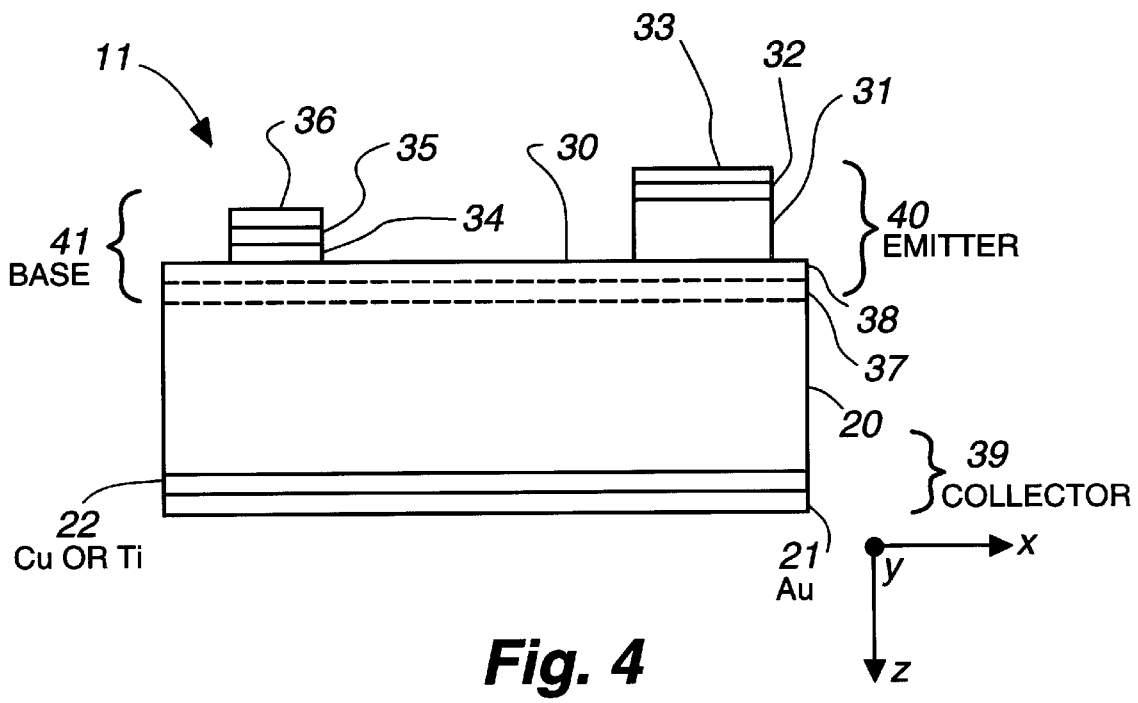
FIG. 4 shows the semiconductor-chip of FIGS. 1–3 in greater detail.

FIG. 1 is a X-Z-plane side view of an assembly 10 in accordance with the present invention. Assembly 10 includes a semiconductor-chip 11, and a chip-carrier substrate 12. FIG. 2 is an exploded view of FIG. 1's assembly 10, again taken in the X-Z plane. FIG. 3 is a top view of FIG. 1's assembly 10 taken in the X-Y plane. FIG. 4 is an X-Z-plane side view showing only semiconductor chip 11.

In this assembly, an aluminum nitride (AlN) chip-carrier, or substrate member 12, includes a top or upper surface 13 that is generally flat or planar in the X-Y plane. Top surface 13, best seen in FIG. 3, is provided with two thin, continuous, and rectangular shaped gold (Au) layer areas, or film areas 15,16, and a third generally L-shaped thin and continuous Au film area 14 that has a first minor portion 17 and a second major portion 117.

By way of example, AlN chip-carrier substrate 12 is from about 0.5 to about 1.0-milli meters thick as measured in the Z-direction, whereas the three Au layers 14–16 are from about 0.3 to about 2.0-micrometers thick as measured in the Z-direction. The manner in which the three Au layers 14–16 are deposited on top surface 13 of chip-carrier substrate 12 is not critical to the invention, and Au layers 14–16 may be deposited by one or more of any of a number of well-known techniques, such as printing, sputtering and/or evaporation.

Reference numeral 11 designates an electrically operable semiconductor-chip 11, or semiconductor-device 11 of non-critical construction and arrangement. Semiconductor-chip 11 has the number N electrodes, and in this case, the number N equals 3. Semiconductor device 11 is manufactured by any one of a number of well known techniques, so as to comprise a semiconductor circuit(s), or device(s), that is designed to operate at a temperature as high as 600-degrees C. That is, device 11 operates in a range from about 0 degrees C. to about 600-degrees C.

By way of example, semiconductor device 11 is from about 0.2 to about 1.3 millimeters thick as measured in the Z-direction, and is about 0.5 to 20.0 millimeters by 05 to 20.0 millimeters as measured in the X-Y plane.

As shown in FIG. 1, semiconductor-chip or die 11 includes a silicon carbide (SiC) body member 20 having a p-SiC region, a n-SiC region, and an n+SiC region. SiC body member 20 also includes two bottom disposed and continuous metallic layers 21,22, the bottom surface 24 of which comprise a generally flat or planar bottom surface 24 that is best seen in FIG. 2. Also as best seen in FIG. 2, the top flat surface 25 of the substrate's Au layer 14 and the bottom flat Au surface 24 of semiconductor chip 11 are what can be defined as two mating Au surfaces that, in accordance with this invention, form a gold-to-gold bond that is operable to physically and electrically mount semiconductor-chip 11 to chip-carrier substrate 12.

As stated above, the bottom surface 26 of SiC body member 20 is coated with two continuous metal layers or films 21,22, i.e. a continuous and bottom disposed Au layer 21, and a continuous and upper disposed chromium (Cr) or titanium (Ti) layer 22. This composite two-layer structure 21,22 operates to provide ohmic contact to SiC body member 20. Bottom disposed Au layer 21 is required in accordance with this invention for gold-to-gold bonding purposes. The upper disposed layer 22 that is formed of Cr or Ti operates to physically bind SiC body 20 to Au bonding layer 21.

By way of example, Au layer 21 is about 1.0 micrometer thick, as measured in the Z-direction, and Cr/Ti layer 22 is about 0.1 micrometer thick, as measured in the Z-direction.

The upper surface 30 of SiC body member 20 cooperates with other active components to form a high temperature semiconductor electronic device; for example, a GaN/SiC transistor.

Shown in FIG. 4 is a three-electrode (i.e., base/emitter/collector) power switch or transistor 11 that is comprised of SiC body member 20, a gallium nitride (GaN) member 31 having a titanium (Ti) layer 32 and a Au layer or electrode 33, and an ohmic contact 34,35,36 to the transistor's base electrode 41, this ohmic contact consisting of a p-type dopant layer 34, a Ti layer 35, and a Au layer or electrode 36. Within SiC body member 20 is an n-type region 37 and a p-type region 38. The Z-direction thickness of the various layers shown in FIG. 4 is within ranges well known to those of skill in the art and will not be described herein.

In the construction and arrangement shown in FIG. 4 for transistor 11, region 21,22 comprises a collector electrode 39, region 31–33 comprises an emitter electrode 40, and region 34–36 comprises a base electrode 41.

As best seen in FIG. 3, two Au wires 45,46 electrically connect the respective two Au layers 33,36 to the two respective Au layers 15,16. In accordance with the construction of FIG. 4, Au layer 15 comprises an emitter input, Au layer 16 comprises a base input, and the minor portion 17 of Au layer 14 comprises a collector output.

Two Au-coated and externally extending tungsten (W) pins 50,51 are physically and electrically bonded to the respective Au layers 15,16, and a third Au-coated and externally extending W pin 52 is bonded to Au layer portion 17, to thereby electrically connect to the two Au wires 45,46, and to Au layer portion 117. Preferably, the inner W core of each of the three pins 50,51,52 is flattened in the X-Y plane prior to an Au coating being applied thereto. This construction and arrangement better facilitates the physical mating and bonding of AU-coated pins 50,51,52 to the top and generally X-Y planar surface of Au areas 15,16,17.

In operation, the externally-extending ends 53,54,55 of the respective Au-coated W pins 50,51,52 are plugged into a circuit board (not shown) where pins are spot welded for operation at elevated temperatures. As an alternative. ends 53,54,55 can be formed in the shape of nail-like pins, and these pins call be plugged into a high temperature socket (not shown).

In accordance with this invention, semiconductor-chip 11 is bonded to AlN chip-carrier substrate 12 by the use of a thermosonic fusing fixture and technique; i.e., the two Au layers 117,21 (see FIG. 2) are pressed, or forced together, in the presence of heat and thermosonic energy, to thereby thermosonically fuse chip, or die assembly 11 to chip-carrier assembly 12 by way of gold-to-gold bonding of gold layer portion 117 to gold layer 21.

Figure 5:
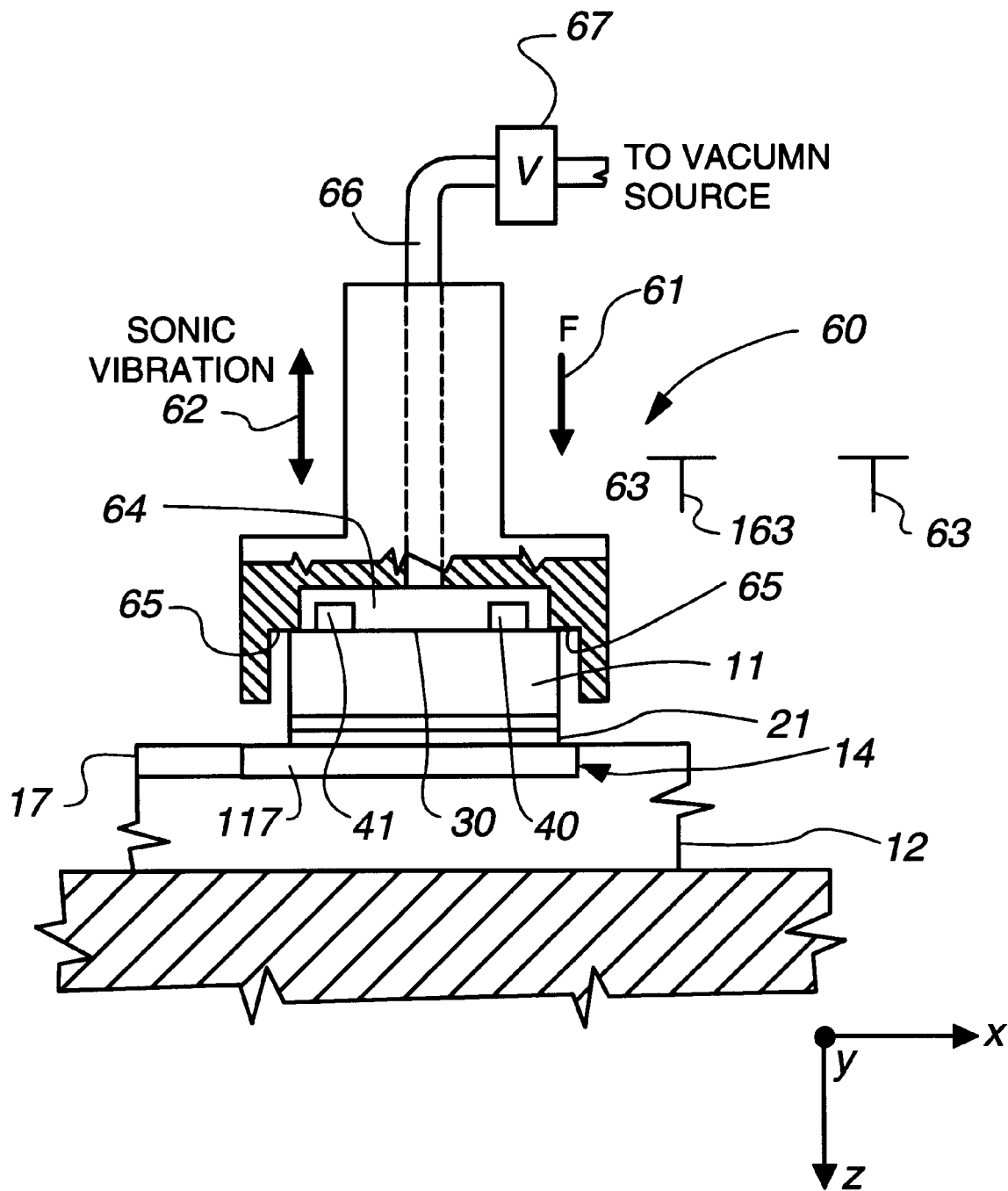
FIG. 5 is a side view, partially in section, showing a tool or fixture that vacuum-grabs, or supports, the semiconductor-chip of FIG. 4 for applying a static force, ultrasonic energy or power, and an elevated temperature to the mating upper semiconductor-chip and lower chip-carrier substrate as shown in FIG. 1.
Figure 6:
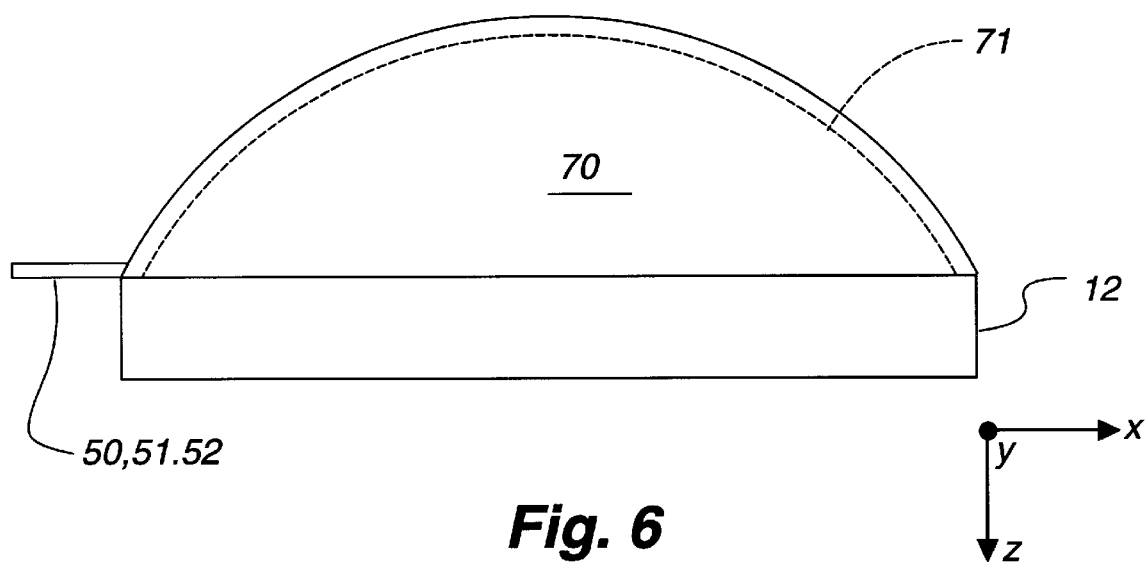
FIG. 6 shows how manufacture of the assembly of FIG. 1 is completed by the use of a non-corrosive, electrically insulative, ceramic paste, and an external coating of a high temperature ceramic glaze that serve to pot the FIG. 1 assembly.
Figure 7:
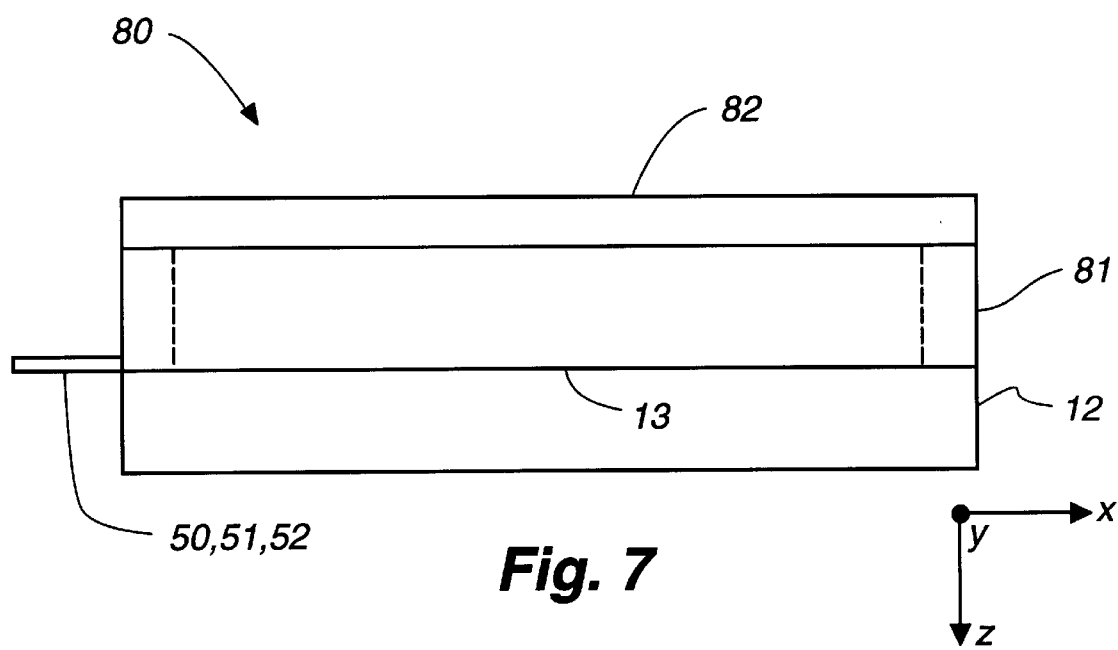
FIG. 7 shows how manufacture of the assembly of FIG. 1 is completed by the use of a hermetically sealed external package that includes a transparent single crystal aluminum nitride (AlN), or sapphire lid or cover, thus serving to encase and seal the FIG. 1 assembly in a manner that enables use of the packaged assembly as an optoelectronic device(s); for example, as a phototransistor(s) and/or a photothyristor(s).

FIG. 5 is an X-Z-plane side view, partially in section, showing a tool, or fixture 60, that vacuum-grabs or vacuum-supports semiconductor-chip 11 of FIG. 4 for applying a static Z-direction force 61, ultrasonic vibratory Z-direction energy or power 62, and an elevated temperature (T) 163 as provided by an oven device (not shown) to the semiconductor-chip surface 24 and the mating chip-carrier substrate surface 25, which two surfaces 24,25 are best seen in FIG. 2.

In an embodiment of the invention, static force 61 was a force in the range of from about 50 Kg per square centimeter to about 100 Kg per square centimeter, sonic power 62 was in the power range of from about 20 watts to about 40 watts at a frequency in the range of about 50 to 70 KHz, and preferably about 60 KHz, and temperature 163 was in the range of about 180-degrees C. to about 230-degrees C.

Fixture 60 includes a vacuum chuck portion 63 having a downward-facing cavity 64 that is configured to receive FIG. 4's upward-extending base 41 and emitter 40 in a non-interfering manner. In order to accomplish this manner of holding semiconductor chip 11, cavity 64 is provided with a downward-facing peripheral shoulder or wall 65 that seals to the surrounding X-Y-plane border of the upper surface 30 of SiC body member 20, this border of surface 30 being shown by dotted line 68 in FIG. 3. A vacuum line 66 connects to a vacuum source (not shown). Vacuum line 66 includes a valve means 67 that is operable to selectively apply vacuum force to cavity 64 in either a manual or an automatic manner.

This invention has been described while making detailed reference to preferred embodiments thereof. However, since it is apparent that those skilled in the art will, upon learning of this invention, visualize yet other embodiments that are within the spirit and scope of this invention, the forgoing detailed description should not be taken as limitations on the spirit and scope of this invention.

What is claimed is:

1. A method of making a semiconductor device, comprising the steps of:

providing an AlN substrate member having a generally flat upper surface;

providing a first and a second generally rectangular shaped and continuous gold layer on said upper surface of said AlN substrate member;

locating said first and second gold layers at a border area of said AlN substrate member;

providing a third generally L-shaped and continuous gold layer on said upper surface of said AlN substrate member, said third gold layer having a minor portion that is formed integrally with a major portion;

locating said third gold layer with said minor portion at a border area of said AlN substrate member, and with said major portion at a middle area of said AlN substrate member;

providing a first, a second and a third, gold-coated, and flat-surface tungsten pin;

gold-to-gold bonding said flat surface of said first, second and third tungsten pins respectively to said first and second gold layers and said minor portion of said third gold layer;

providing each of said first, second and third gold-coated tungsten pins with an end that extends beyond said border area of said AlN substrate member;

providing a high temperature, three-electrode, SiC and GaN-based, semiconductor chip having a generally flat bottom gold surface that comprises a first electrode, and having an upper surface with a second gold electrode and a third gold electrode thereon;

gold-to-gold bonding said bottom gold surface of said semiconductor chip to said major portion of said third gold layer in the concomitant presence of static force, ultrasonic energy, and an elevated temperature;

providing a first gold wire connected between said upper surface second gold electrode and said first gold layer; and providing a second gold wire connected between said upper surface third gold electrode and said second gold layer.

2. The method of combination of claim 1 including the step of:

providing an electrically insulative paste covering said upper surface of said AlN substrate member exclusive of said extending ends of said first, second and third gold-coated tungsten pins.

3. The method of claim 1 including the steps of:

providing said semiconductor chip as an optoelectronic semiconductor device;

providing an electrically insulative wall member having a bottom wall surface sealed to said border area of said AlN substrate member; and providing an optically transparent cover sealed to a top wall surface of said wall member.

4. The method of claim 3 wherein said cover is selected from the group single crystal AlN and sapphire.

5. The method of claim 1 wherein:

said static force is in the range of about 50 Kg to about 100 Kg per square centimeter;

said ultrasonic energy is in the power range of about 20 watts to about 40 watts at a frequency of about 60 KHz; and said elevated temperature is in a range of from about 180-degrees C. to about 230-degrees C.

6. A method of making a high temperature semiconductor assembly having the number N of electrodes comprising the steps of:

providing an electrically inert substrate having a generally flat upper-substrate-surface;

providing the number N of gold connection-areas on said upper-substrate-surface in a manner to be physically separate and spaced from each other, and in a manner to be located adjacent to a border area of said upper-substrate-surface;

providing a gold chip-mounting-area on said upper-substrate-surface in a manner to be isolated from said N gold connection-areas, in a manner to be located inward of said border area of said upper-substrate-surface, and in a manner to be connected to a first of said N gold connection-areas;

providing the number N of gold-coated and flat-surface pins;

gold-to-gold bonding said the flat surfaces of said N flat-surface pins respectively to individual ones of said N gold connection-areas in a manner whereby each of said N gold-coated pins have an end that extends beyond said border area of said upper-substrate-surface;

providing an N-electrode semiconductor chip having an upper-chip-surface and a generally flat bottom-chip-surface;

providing a first continuous layer on said bottom-chip-surface;

providing a second continuous gold layer on said first continuous layer, said second continuous gold layer comprising a first gold-electrode of said N-electrode semiconductor chip;

gold-to-gold bonding said second continuous gold layer to said gold chip-mounting-area by the application of static force that is directed generally normal to said upper-substrate-surface, by the concomitant application of oscillating ultrasonic energy that is directed generally normal to said upper-substrate-surface, and by the concomitant application of an elevated temperature; and providing the number N-1 of gold electrodes on said upper-chip-surface; and connecting the number N-1 of gold wires respectively between individual ones of said N-1 gold electrodes and said second through N gold connection-areas.

7. The method of claim 6 including the step of:

providing an electrically insulative paste to cover said upper-substrate-surface and said semiconductor chip.

8. The method of claim 6 including the steps of:

providing said semiconductor chip as an optoelectronic semiconductor device;

providing an electrically insulative wall member having a bottom wall surface;

sealing said bottom wall surface to said border area of said upper-substrate-surface; providing an optically transparent cover member; and sealing said cover member to a top wall surface of said wall member.

9. The method of claim 8 wherein said cover is selected from the groups single crystal AlN and sapphire.

10. A method of making a high temperature semiconductor assembly comprising the steps of:

providing a SiC body member having an upper surface that contains a GaN-based emitter-electrode and a base-electrode, and having a generally flat bottom surface that contains a continuous layer of a material selected from the group chromium and titanium;

providing a continuous gold layer on said layer selected from the group chromium and titanium, said continuous gold layer comprising a collector-electrode;

providing an AlN substrate having a generally flat upper-substrate-surface;

providing a first, a second, and a third gold area on said upper-substrate-surface in a manner to be physically separate and spaced from each other, and in a manner to be located adjacent to a border area of said upper-substrate-surface;

providing a gold chip-mounting-area on said upper-substrate-surface in a manner to be isolated from first and second gold areas, in a manner to be connected to said third gold area, and in a manner to be located inward of said border area of said upper-substrate-surface;

gold-to-gold bonding said collector-electrode to said gold chip-mounting-area by the application of static force that is directed generally normal to said upper-substrate-surface, by the concomitant application of oscillating ultrasonic energy that is directed generally normal to said upper-substrate-surface, and by the concomitant application of an elevated temperature;

connecting a first wire between said emitter-electrode and said first gold area; and connecting a second wire between said gate-electrode and said second gold area.

11. The method of claim 10 including the step of:

providing an electrically insulative and generally optically opaque paste to cover said upper-substrate-surface and said SiC body member.

12. The method of claim 10 including the steps of:

providing said SiC body member having said emitter-electrode, said base-electrode, and said collector-electrode as an optoelectronic member;

providing an electrically insulative wall member having a bottom wall surface;

sealing said bottom wall surface to said border area of said upper-substrate-surface;

providing an optically transparent cover member; and sealing said cover member to a top wall surface of said wall member.

13. A method of making a semiconductor assembly comprising the steps of:

providing a semiconductor-chip having a continuous gold-layer coating a generally flat surface thereof;

providing a chip-carrier having a continuous gold-mounting-layer on a generally flat surface thereof;

supporting said semiconductor-chip in a vacuum chuck with said continuous gold-layer in physical engagement with said continuous gold-mounting-layer;

applying a unidirectional force to said vacuum chuck normal to said continuous gold-mounting-layer and in a force range of from about 50 to about 100 Kg;

concomitantly applying bidirectional ultrasonic energy to said vacuum chuck normal to said continuous gold-mounting-layer and while said unidirectional force is applied thereto, said ultrasonic energy being in a range of from about 20 to about 40 watts, and said ultrasonic energy being in a frequency range of about 50 to about 70 KHz; and concomitantly applying an elevated temperature to said physical engagement of said continuous gold-layer and said continuous gold-mounting-layer while said unidirectional force and said bidirectional ultrasonic force are applied to said vacuum chuck, said elevated temperature being in the range of from about 180 to 230-degrees C.

14. The method of claim 13 including the step of:

encasing said semiconductor assembly in a potting ceramic.

15. The method of claim 13 wherein said semiconductor assembly is an optoelectronic assembly, and including the step of;

encasing said optoelectronic assembly in a housing that includes a transparent cover.

* * * * *